(12) United States Patent
Wu et al.

(10) Patent No.: US 11,348,972 B1
(45) Date of Patent: May 31, 2022

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Baolei Wu, Hefei (CN); Xiaoguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/648,214

(22) Filed: Jan. 18, 2022

Related U.S. Application Data

(63) Continuation of application No. PCT/CN2021/102238, filed on Jun. 25, 2021.

(30) Foreign Application Priority Data

Dec. 29, 2020 (CN) .......................... 202011598015.4

(51) Int. Cl.
| | | |
|---|---|---|
| *H01L 27/22* | (2006.01) | |
| *H01L 27/24* | (2006.01) | |
| *H01L 27/11507* | (2017.01) | |
| *H01L 27/108* | (2006.01) | |

(52) U.S. Cl.
CPC ...... *H01L 27/228* (2013.01); *H01L 27/10808* (2013.01); *H01L 27/11507* (2013.01); *H01L 27/2436* (2013.01)

(58) Field of Classification Search
CPC ............. H01L 27/228; H01L 27/10808; H01L 27/11507; H01L 27/2436
See application file for complete search history.

(56) References Cited

U.S. PATENT DOCUMENTS

| | | |
|---|---|---|
| 6,121,080 A | 9/2000 | Wu |
| 7,119,389 B2 | 10/2006 | Lee et al. |
| 7,505,299 B2 | 3/2009 | Takemura et al. |
| 8,263,460 B2 | 9/2012 | Kim |
| 8,542,519 B2 | 9/2013 | Asao et al. |
| 9,018,691 B2 | 4/2015 | Chen et al. |

(Continued)

FOREIGN PATENT DOCUMENTS

| | | |
|---|---|---|
| CN | 1495906 A | 5/2004 |
| CN | 1702869 A | 11/2005 |

(Continued)

OTHER PUBLICATIONS

International Search Report and English Translation cited in PCT/CN2021/102238 dated Sep. 28, 2021, 9 pages.

(Continued)

*Primary Examiner* — Allison Bernstein
(74) *Attorney, Agent, or Firm* — Cooper Legal Group, LLC

(57) ABSTRACT

A semiconductor structure and a method for manufacturing a semiconductor structure are provided. The semiconductor structure includes a substrate; a first transistor, including a first channel region located in the substrate; a second transistor, including a second channel region located in the substrate, the second channel region having an area different from an area of the first channel region, and the first transistor and the second transistor having a common source or a common drain; and a memory cell, connected to the common source or the common drain.

15 Claims, 4 Drawing Sheets

(56) References Cited

U.S. PATENT DOCUMENTS

| | | | |
|---|---|---|---|
| 9,299,842 B2* | 3/2016 | Baek | ............... G06F 30/398 |
| 9,853,031 B1* | 12/2017 | Cho | ............... H01L 29/0649 |
| 10,199,379 B2 | 2/2019 | Cho et al. | |
| 10,373,959 B2 | 8/2019 | Im et al. | |
| 10,468,103 B2 | 11/2019 | Kim et al. | |
| 10,854,617 B2 | 12/2020 | Derner et al. | |
| 10,886,280 B2 | 1/2021 | Lee et al. | |
| 11,177,264 B2 | 11/2021 | Jeon et al. | |
| 2006/0237726 A1 | 10/2006 | Iwamatsu et al. | |
| 2008/0073709 A1 | 3/2008 | Fujimoto et al. | |
| 2014/0077303 A1 | 3/2014 | Baek | |
| 2017/0033279 A1 | 2/2017 | Lee | |

FOREIGN PATENT DOCUMENTS

| | | |
|---|---|---|
| CN | 102214578 A | 10/2011 |
| CN | 103904082 A | 7/2014 |
| CN | 104134456 A | 11/2014 |
| CN | 106158751 A | 11/2016 |
| CN | 106935508 A | 7/2017 |
| CN | 107731907 A | 2/2018 |
| CN | 108133936 A | 6/2018 |
| CN | 109524399 A | 3/2019 |
| CN | 110111822 A | 8/2019 |
| CN | 209641689 U | 11/2019 |
| CN | 110943102 A | 3/2020 |
| CN | 111223862 A | 6/2020 |
| CN | 111755386 A | 10/2020 |
| CN | 111799260 A | 10/2020 |
| JP | H08316427 A | 11/1996 |
| JP | 2014049725 A | 3/2014 |

OTHER PUBLICATIONS

Written Opinion and English Translation cited in PCT/CN2021/102238 dated Sep. 28, 2021, 6 pages.

International Search Report and English Translation cited in PCT/CN2021/095830 dated Sep. 13, 2021, 8 pages.

Chen, An "A review of emerging non-volatile memory (NVM) technologies and applications", journal homepage: www.elsevier.com/locate/sse, SSE, 2016, 25-38.

Kibuule et al., "CMOS Effective Channel Size Measurements", Superconducting Super Collider Laboratory, Jan. 1994, 8 pages.

Patel et al., "Field Driven STT-MRAM Cell for Reduced Switching Latency and Energy", ISCAS, 2014, pp. 2173-2176.

Schloesser et al., "A 6F2 Buried Wordline DRAM Cell for 40nm and Beyond", University of Science and Technology of China, downloaded on Nov. 26, 202, 4 pages.

International Search Report and English Translation cited in PCT/CN2021/095837 dated Sep. 9, 2021, 9 pages.

International Search Report and English Translation cited in PCT/CN2021/095828 dated Sep. 15, 2021, 8 pages.

* cited by examiner

SEMICONDUCTOR STRUCTURE AND MANUFACTURING METHOD THEREOF

CROSS-REFERENCE TO RELATED APPLICATIONS

The present application is a continuation application of International Patent Application No. PCT/CN2021/102238, titled "SEMICONDUCTOR STRUCTURE AND MANUFACTURING METHOD THEREOF" and filed on Jun. 25, 2021, which claims the priority to Chinese Patent Application 202011598015.4, titled "SEMICONDUCTOR STRUCTURE AND MANUFACTURING METHOD THEREOF" and filed to the CNIPA on Dec. 29, 2020. The entire contents of International Patent Application No. PCT/CN2021/102238 and Chinese Patent Application 202011598015.4 are incorporated herein by reference.

TECHNICAL FIELD

The present application relates to the field of semiconductor technology, and in particular to, a semiconductor structure and a method for manufacturing a semiconductor structure.

BACKGROUND

A memory is an important part of a computer architecture, and has a decisive influence on the speed, integration and power consumption of the computer. The basic cell of the traditional memory usually realizes read and write functions through a memory cell (such as a magnetic memory cell) and a drive transistor connected in series. However, the read and write success rate of the memory based on the magnetic memory cell has different electrical requirements for the transistor, resulting in a low read and write success rate of the magnetic memory cell.

SUMMARY

According to various embodiments, a semiconductor structure and a method for manufacturing a semiconductor structure are provided.

A semiconductor structure, including:

a substrate;

a first transistor, including a first channel region located in the substrate;

a second transistor, including a second channel region located in the substrate, the second channel region having an area different from an area of the first channel region, and the first transistor and the second transistor having a common source or a common drain; and a memory cell, connected to the common source or the common drain.

A method for manufacturing a semiconductor structure, including:

providing a substrate;

forming a first transistor and a second transistor in the substrate, the first transistor including a first channel region located in the substrate, the second transistor including a second channel region located in the substrate, the second channel region having an area different from an area of the first channel region, and the first transistor and the second transistor having a common source or a common drain; and forming a memory cell, the memory cell being connected to the common source or the common drain.

BRIEF DESCRIPTION OF THE DRAWINGS

In order to explain technical solutions in embodiments of the present application or in the prior art more clearly, the accompanying drawings to be used for describing the embodiments of the present application or the prior art will be introduced simply. Apparently, the accompanying drawings to be described below are merely some embodiments of the present application. A person of ordinary skill in the art may obtain other drawings according to these drawings without paying any creative effort.

DETAILED DESCRIPTION

Figure 1:
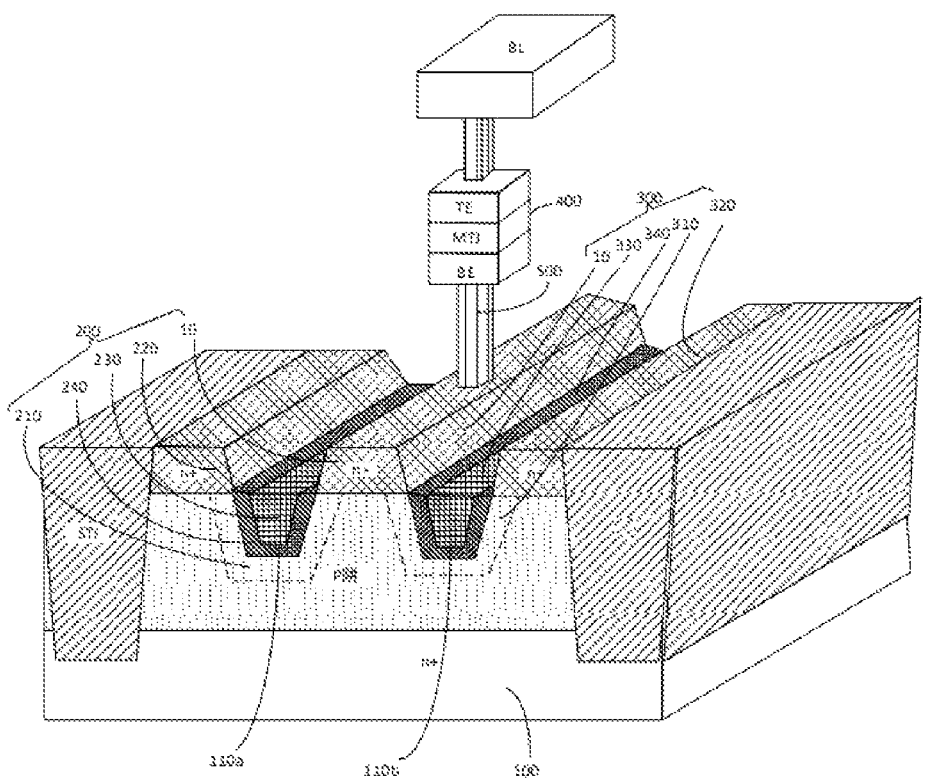
FIG. 1 is a schematic structure diagram of a semiconductor structure according to an embodiment.

In order to facilitate the understanding of the present application, the present application will be described more comprehensively below with reference to the relevant accompanying drawings. Embodiments of the present application are shown in the drawings. However, the present application may be implemented in many different forms, and is not limited to the embodiments described herein. Rather, these embodiments are provided so that the disclosure of the present application is more thorough and comprehensive.

Unless otherwise defined, all technological and scientific terms used herein have the same meanings as commonly understood by those of ordinary skill in the technical field of the present application. The terms used in the description of the present application are only for the purpose of describing specific embodiments, but are not intended to limit the present application.

It should be understood that, when an element or layer is referred to as being "on", "adjacent to", "connected to", or "coupled to" other element or layer, the element or layer may be directly on, adjacent to, connected to, or coupled to the other element or layer, or there may be an intermediate element or layer therebetween. In contrast, when an element is referred to as being "directly on", "directly adjacent to", "directly connected to", or "directly coupled to" other element or layer, there is no intermediate element or layer therebetween. It should be understood that, although the terms first, second, third, etc. may be used to describe various elements, components, regions, layers, doping types and/or portions, these elements, components, regions, layers, doping types and/or portions should not be restricted by these terms. These terms are only used to distinguish one element, component, region, layer, doping type or portion from another element, component, region, layer, doping type or portion. Therefore, without departing from the teachings of the present application, the first element, component, region, layer, doping type or portion discussed below may be expressed as a second element, component, region, layer or portion; for example, the first doping type may be expressed as the second doping type, and similarly, the second doping type may be expressed as the first doping type; the first doping type and the second doping type are different doping types, for example, the first doping type may be P-type and the second doping type may be N-type, or the first doping type may be N-type and the second doping type may be P-type.

Spatial relationship terms such as "under", "below", "lower", "beneath", "above", "upper", etc. may be used here to describe the relationship between one element or feature shown in the figure and other element or feature. It should be understood that, in addition to the orientations shown in the figures, the spatial relationship terms also include different orientations of devices in use and operation. For example, if a device in the figure is turned over, an element or feature described as "below" or "under" or "beneath" other element will be oriented "on" the other element or feature. Therefore, the exemplary terms "below" and "under" may include both orientations of above and below. In addition, the device may also include another orientation (for example, 90-degree rotation or other orientation), and the spatial terms used herein are interpreted accordingly.

When used herein, the singular forms of "a", "an" and "the/this" may also include plural forms, unless the context clearly indicates otherwise. It should also be understood that the terms "comprise/include" or "have" and the like designate the existence of the stated features, wholes, steps, operations, components, parts, or combinations thereof, but do not exclude the existence or addition of one or more other features, wholes, steps, operations, components, parts, or combinations thereof. Meanwhile, in this specification, the term "and/or" includes any and all combinations of relevant items listed.

The embodiments of the application are described here with reference to schematic diagrams of ideal embodiments (and intermediate structures) of the present application, so that changes in the shape shown due to, for example, manufacturing technology and/or tolerances can be expected. Therefore, the embodiments of the present application should not be limited to the specific shapes of regions shown here, but include shape deviations due to, for example, manufacturing technology. For example, an implanted region shown as a rectangle usually has round or curved features and/or implant concentration gradients at its edges, rather than a binary change from the implanted region to a non-implanted region. Likewise, a buried region formed by implantation may result in some implantation in a region between the buried region and a surface through which the implantation proceeds. Therefore, the regions shown in the figures are substantially schematic, and their shapes do not represent the actual shapes of regions of a device, and do not limit the scope of the present application.

In one embodiment, referring to FIG. 1, a semiconductor structure is provided, including a substrate 100, a first transistor 200, a second transistor 300, and a memory cell 400.

The substrate 100 may be, but is not limited to, a semiconductor substrate such as a silicon, gallium nitride, gallium arsenide, gallium carbide, silicon carbide, or SOI substrate. Both the first transistor 200 and the second transistor 300 are formed in the substrate 100.

The first transistor 200 includes a first channel region 210 and a first terminal 220. The first channel region 210 is located inside the substrate 100, and the first terminal 220 is located on a surface of the substrate 100.

It can be understood that the first channel region 210 may be a region where a conductive channel is formed when the first transistor 200 is turned on.

The first terminal 220 may be configured as a source, or the first terminal 220 may also be configured as a drain.

The second transistor 300 includes a second channel region 310 and a second terminal 320. The second channel region 310 is located inside the substrate 100, and the second terminal 320 is located on the surface of the substrate 100.

Similarly, it can be understood that the second channel region 310 may be a region where a conductive channel is formed when the second transistor 300 is turned on.

The second terminal 320 may be configured as a source, or the second terminal 320 may also be configured as a drain.

The first terminal 220 of the first transistor 200 and the second terminal 320 of the second transistor 300 are heavily doped sources or drains, both of which can be connected to signal lines to read or write data.

The first transistor 200 and the second transistor 300 have a common terminal 10, and the common terminal 10 is a common source or a common drain of the first transistor 200 and the second transistor 300.

One end of the memory cell 400 is connected to the common terminal 10, and the other end may be connected to a bit line (BL). Specifically, the memory cell 400 may be connected to the common terminal 10 and the bit line BL by a conductive plug 500, respectively.

As an example, the memory cell 400 may be any one of a capacitive memory cell, a resistive memory cell, a magnetic memory cell, a phase change memory cell, and a ferroelectric memory cell.

The second channel region 310 of the second transistor 300 has an area different from that of the first channel region 210 of the first transistor 200. Specifically, as shown in FIG. 1, the first transistor 200 and the second transistor 300 have a common terminal 10, the common terminal 10 may be a common source or a common drain of the first transistor 200 and the second transistor 300, a surface region of the substrate 100 between the common terminal 10 and the first terminal 220 is the first channel region 210 of the first transistor 200, and a surface region of the substrate 100 between the common terminal 10 and the second terminal 320 is the second channel region 310 of the second transistor 300. The area of the first channel region 210 may be a surface area of the first channel region 210 on the substrate 100; the area of the second channel region 310 may be a surface area of the second channel region 310 on the substrate 100; as shown in FIG. 1, the first channel region 210 is U-shaped on the substrate 100, and the area of the first channel region 210 may be a sum of a bottom area of the U-shape and a side wall area of the U-shape. Similarly, the second channel region 310 is U-shaped on the substrate 100, and the area of the second channel region 310 may be a sum of a bottom area of the U-shape and a side wall area of the U-shape.

Therefore, the semiconductor structure in this embodiment can meet different requirements of read and write and improve the success rate of data read and write.

In one embodiment, the first channel region 210 has a first width, and the second channel region 310 has a second width, wherein the second width is greater than the first width. As shown in FIG. 1, the first width of the first channel region 210 may be the length of a line where the first channel region 210 intersects the first terminal 220, and the second width of the second channel region 310 may be the length of a line where the second channel region 310 intersects the second terminal 320.

For example, when the memory cell 400 is a magnetic memory cell, it may include a magnetic tunnel junction (MTJ). As such, the first transistor 200 having the first channel region 210 with a smaller width may be selected as a data reading transistor, and the second transistor 300 having the second channel region 310 with a larger width may be selected as a data writing transistor.

Specifically, when data is read from the memory cell 400, the first transistor 200 is turned on and the second transistor 300 is turned off; when data is written into the memory cell 400, the first transistor 200 is turned off and the second transistor 300 is turned on. By configuring the second width to be greater than the first width, the driving current of the second transistor 300 is greater than that of the first transistor 200, thereby meeting the requirement of different driving currents of the first transistor 200 and the second transistor 300. As such, the misread rate and the miswrite rate of data can be reduced at the same time, thereby increasing the success rate of data read and write.

Further, the semiconductor structure may further include a bottom electrode BE and a top electrode TE, and the bottom electrode BE and the top electrode TE are respectively located at the bottom and top of the magnetic tunnel junction (MTJ).

In one embodiment, the second width is 2 to 5 times the first width. As such, the driving current of the second transistor can be effectively increased, and the problem of excessive width, which leads to excessive area occupation and lower storage density, can be avoided.

Figure 2:
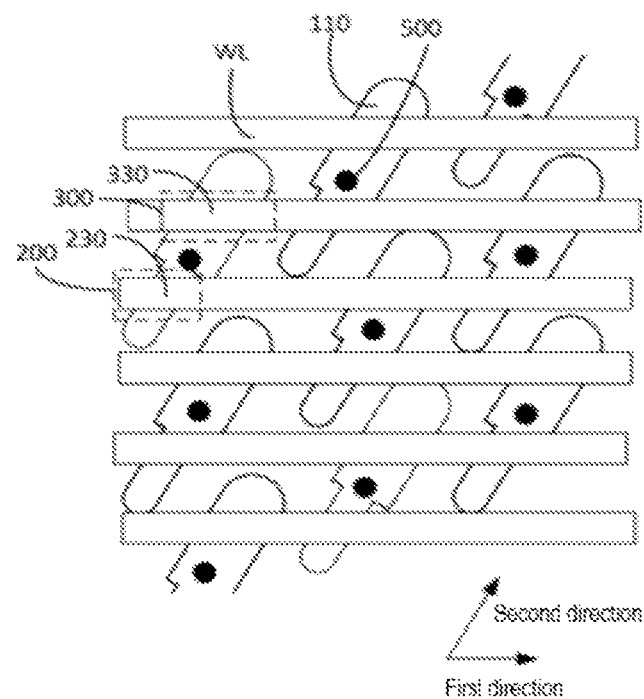
FIG. 2 is a schematic plan view of a semiconductor structure according to an embodiment.
Figure 3:
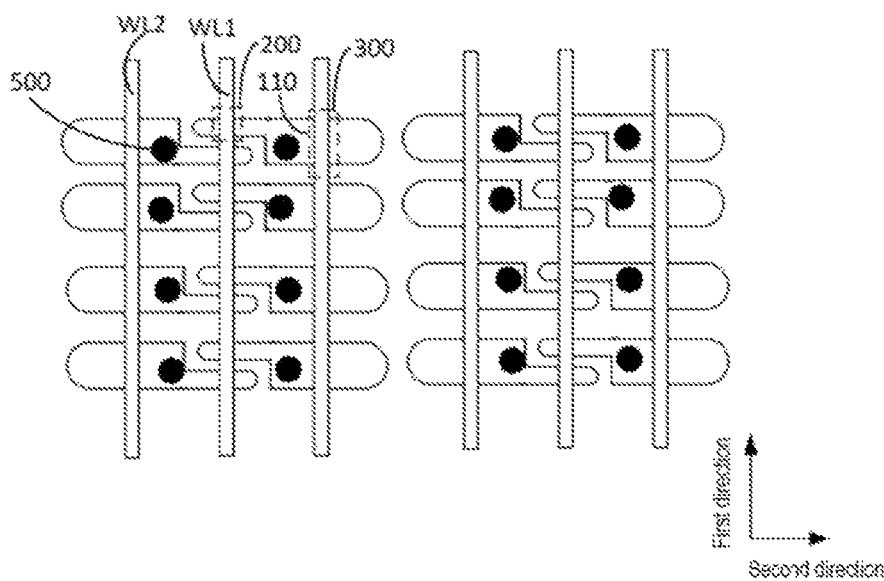
FIG. 3 is a schematic plan view of a semiconductor structure according to another embodiment.

In one embodiment, referring to FIG. 2 or FIG. 3, the substrate 100 further includes at least one active region 110. The active region 110 is formed in the substrate 100. The first transistor 200 and the second transistor 300 are formed in the active region 110. One active region 110 corresponds to one memory cell.

As an example, specifically, referring to FIG. 1 at the same time, ions may be implanted into the substrate 100 to form a well region of a first conductive type. The first conductive type may be P-type or N-type. When the first conductive type is P-type, the first terminal 220 of the first transistor 200, the second terminal 320 of the second transistor 300, and the common terminal 10 of the first transistor 200 and the second transistor 300 are N-type. When the first conductive type is N-type, the first terminal 220 of the first transistor 200, the second terminal 320 of the second transistor 300, and the common terminal 10 of the first transistor 200 and the second transistor 300 are P-type.

Shallow trench isolation (STI) structures may be further formed on the substrate 100, and a plurality of active regions 110 are isolated in the substrate 100 through the shallow trench isolation structures. The first transistor 200 and the second transistor 300 are formed in the active region 110.

In this embodiment, the first transistor 200 and the second transistor 300 are distributed on two opposite sides of the extension direction of the active region 110. In addition, the first transistor 200 and the second transistor 300 located in the active region 110 have a common terminal 10.

The common terminal 10 may be connected to the memory cell, and may be a source or a drain.

In this embodiment, the first transistor 200 and the second transistor 300 share the common terminal 10, which can effectively control read and write operations of the memory cell, thereby improving the success rate of data read and write.

In one embodiment, referring to FIG. 2, the semiconductor structure further includes a plurality of word lines WL extending in a first direction. The word lines WL are used to provide gate voltage signals for the first transistor 200 and the second transistor 300.

The portion of the word line WL corresponding to the active region 110 may serve as a first gate 230 of the first transistor 200 and/or a second gate 330 of the second transistor 300. Specifically, as shown in FIGS. 1 and 2, the word lines WL may be buried word lines, and the two word lines WL pass through the same active region 110; the portion of the word line WL that overlaps the active region 110 may serve as the first gate 230 of the first transistor 200 and/or the second gate 330 of the second transistor 300. The bottom and side walls of the first gate 230 are opposite to the first channel region 210 of the first transistor 200, and the bottom and side walls of the second gate 330 are opposite to the second channel region 310 of the second transistor 300.

In this embodiment, a plurality of active regions 110 is staggered. In addition, each active region 110 extends in a second direction, and the second direction is inclined at a preset angle with respect to the first direction. The preset angle may be between 15° and 30°.

Within the limited substrate space, more active regions can be arranged, thereby increasing the density of memory cells.

Further, in the second direction, the first transistors 200 and the second transistors 300 located in the adjacent active regions 110 are disposed opposite to each other.

The active regions 110 are arranged in a staggered array. The arrangement of the active regions 110 is more regular, so that the performance of the memory formed is more uniform and stable everywhere, and the layout design is convenient.

Furthermore, in the first direction, the first transistors 200 and the second transistors 300 located in the adjacent active regions 110 correspond to the same word line WL.

As such, the density of the active regions 110 in the substrate 100 can be further increased, thereby increasing the density of memory cells.

In one embodiment, referring to FIG. 3, every two active regions 110 among the plurality of active regions 110 constitute an active region pair. And, the active region pairs are arranged in an array. Meanwhile, the first transistors 200 of two active regions 110 in each active region pair are adjacent and opposite to each other.

In the central part of each active region pair, two first transistors 200 can be arranged side by side, which can effectively save substrate space. Therefore, in the limited substrate space, more active regions can be arranged, thereby increasing the density of memory cells.

Further, the semiconductor structure may include a plurality of word lines WL extending in the first direction. Meanwhile, the word lines WL may include first word lines WL1 and second word lines WL2 alternately arranged in the second direction.

The first word line WL1 penetrates the first transistors 200 of the active regions in the active region pairs of the same column, and the second word line WL2 penetrates the second transistors 300 of the active regions in the active region pairs of the same column.

In addition, the two first transistors 200 in the same active region pair are penetrated by the same first word line WL1. As such, the density of the active regions 110 in the substrate 100 can be further increased, thereby increasing the density of memory cells.

Furthermore, the extension direction of the active regions 110 is the second direction. At this time, the first direction may be perpendicular to the second direction, which facilitates the layout design of the word lines WL.

Figure 4:
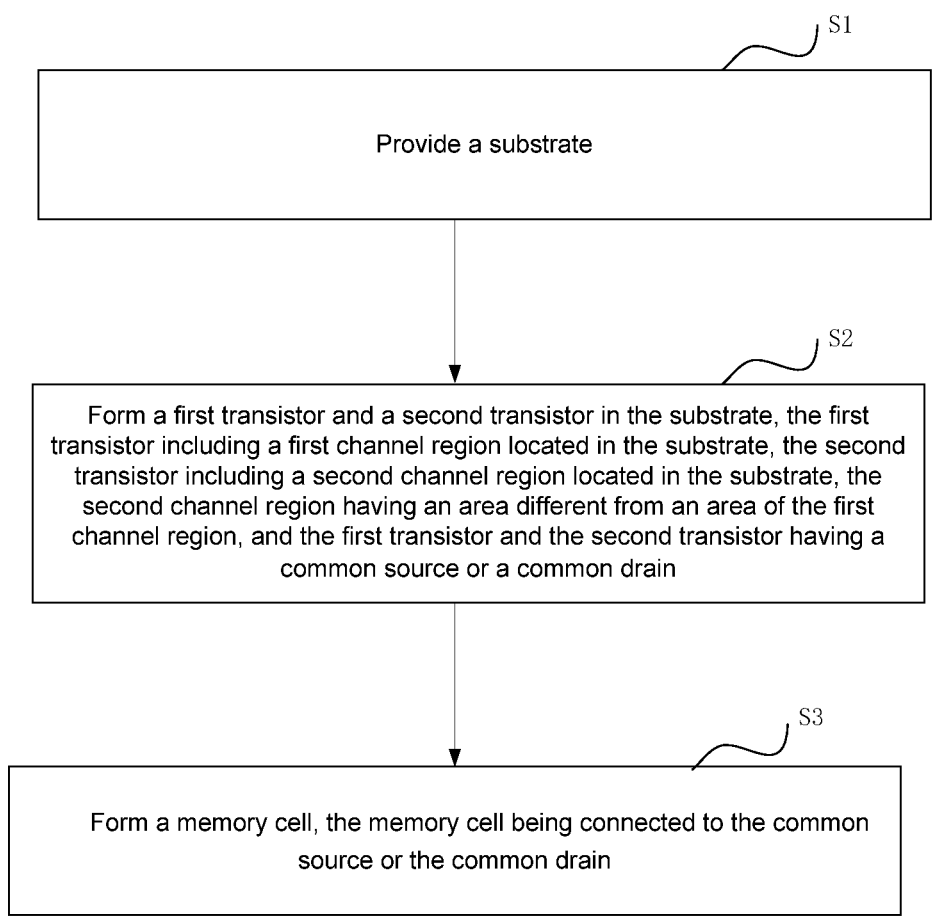
FIG. 4 is a flowchart of a method for manufacturing a semiconductor structure according to an embodiment.

In one embodiment, referring to FIG. 4, a method for manufacturing a semiconductor structure is provided, including:

Step S1, a substrate 100 is provided;

Step S2, a first transistor 200 and a second transistor 300 are formed in the substrate 100, the first transistor 200 including a first channel region 210 located in the substrate 100, the second transistor 300 including a second channel region 310 located in the substrate 100, the second channel region 310 having an area different from that of the first channel region 210, and the first transistor 200 and the second transistor 300 having a common source or a common drain;

Step S3, a memory cell 400 is formed, the memory cell 400 being connected to the common source or the common drain.

The substrate 100 may be, but is not limited to, a semiconductor substrate such as a silicon, gallium nitride, gallium arsenide, gallium carbide, silicon carbide, or SOI substrate.

The first transistor 200 includes a first channel region 210 and a first terminal 220. The first channel region 210 is located inside the substrate 100, and the first terminal 220 is located on a surface of the substrate 100.

The first channel region 210 may be a region where a conductive channel is formed when the first transistor 200 is turned on. The first terminal 220 may be a drain or a source.

The second transistor 300 includes a second channel region 310 and a second terminal 320. The second channel region 310 is located inside the substrate 100, and the second terminal 320 is located on the surface of the substrate 100.

Similarly, it can be understood that the second channel region 310 may be a region where a conductive channel is formed when the second transistor 300 is turned on.

The second terminal 320 may be configured as a source or a drain.

The memory cell 400 is a device unit capable of implementing a storage function. As an example, the memory cell 400 may be any one of a capacitive memory cell, a resistive memory cell, a magnetic memory cell, a phase change memory cell, and a ferroelectric memory cell.

The second channel region 310 of the second transistor 300 has an area different from that of the first channel region 210 of the first transistor 200.

Specifically, as shown in FIG. 1, the first transistor 200 and the second transistor 300 have a common terminal 10, the common terminal 10 may be a common source or a common drain of the first transistor 200 and the second transistor 300, a surface region of the substrate 100 between the common terminal 10 and the first terminal 220 is the first channel region 210 of the first transistor 200, and a surface region of the substrate 100 between the common terminal 10 and the second terminal 320 is the second channel region 310 of the second transistor 300.

The area of the first channel region 210 may be a surface area of the first channel region 210 on the substrate 100; the area of the second channel region 310 may be a surface area of the second channel region 310 on the substrate 100; as shown in FIG. 1, the first channel region 210 is U-shaped on the substrate 100, and the area of the first channel region 210 may be a sum of a bottom area of the U-shape and a side wall area of the U-shape. Similarly, the second channel region 310 is U-shaped on the substrate 100, and the area of the second channel region 310 may be a sum of a bottom area of the U-shape and a side wall area of the U-shape.

Therefore, the semiconductor structure formed by the method of this embodiment can meet different requirements of read and write and improve the success rate of data read and write.

In one embodiment, the first channel region 210 has a first width, and the second channel region 310 has a second width, wherein the second width is greater than the first width.

As shown in FIG. 1, the first width of the first channel region 210 may be the length of a line where the first channel region 210 intersects the first terminal 220, and the second width of the second channel region 310 may be the length of a line where the second channel region 310 intersects the second terminal 320.

For example, when the memory cell 400 is a magnetic memory cell, it may include a magnetic tunnel junction (MTJ). As such, the first transistor 200 having the first channel region 210 with a smaller width may be selected as a data reading transistor, and the second transistor 300 having the second channel region 310 with a larger width may be selected as a data writing transistor.

Specifically, when data is read from the memory cell 400, the first transistor 200 is turned on and the second transistor 300 is turned off; when data is written into the memory cell 400, the first transistor 200 is turned off and the second transistor 300 is turned on. By configuring the second width to be greater than the first width, the driving current of the second transistor 300 is greater than that of the first transistor 200, thereby meeting the requirement of different driving currents of the first transistor 200 and the second transistor 300. As such, the misread rate and the miswrite rate of data can be reduced at the same time, thereby increasing the success rate of data read and write.

In one embodiment, the second width is 2 to 5 times the first width. As such, the driving current of the second transistor can be effectively increased, and the problem of excessive width, which leads to excessive area occupation and lower storage density, can be avoided.

Figure 5:
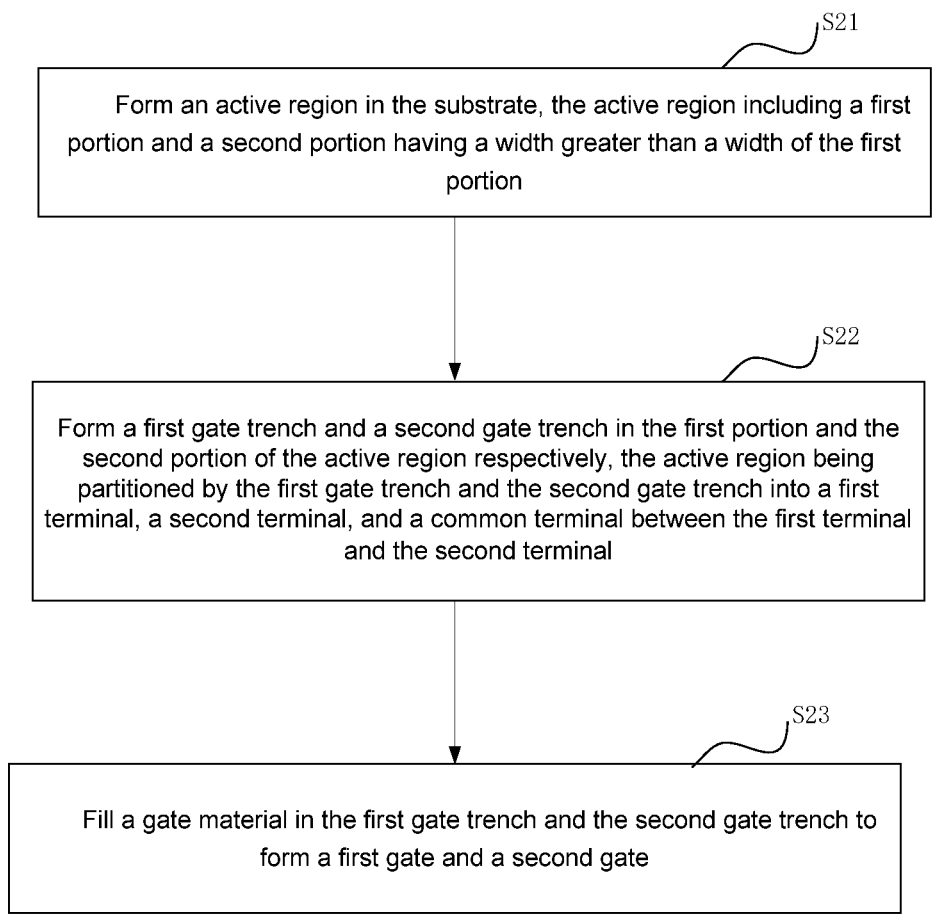
FIG. 5 is a flowchart of forming a first transistor and a second transistor in a substrate according to an embodiment.

In one embodiment, referring to FIG. 5 and FIG. 1, step S2 specifically includes:

Step S21, an active region 110 is formed in the substrate 100, the active region 110 including a first portion and a second portion having a width greater than that of the first portion;

Step S22, a first gate trench 110a and a second gate trench 110b are respectively formed in the first portion and the second portion of the active region 110, the active region being partitioned by the first gate trench 110a and the second gate trench 110b into the first terminal 220, the second terminal 320, and the common terminal 10 between the first terminal 220 and the second terminal 320;

Step S23, a gate material is filled in the first gate trench 110a and the second gate trench 110b to form a first gate 230 and a second gate 330.

The first gate 230 is a gate of the first transistor 200, and the second gate 330 is a gate of the second transistor 300. The bottom and side walls of the first gate 230 are opposite to the first channel region 210. The bottom and side walls of the second gate 330 are opposite to the second channel region 310.

That is, the first transistor 200 includes the first gate 230, the first channel region 210, the first terminal 220, and the common terminal 10. The first terminal 220 and the common terminal 10 are respectively a drain and a source of the first transistor 200. It can be understood that there may also be a first gate dielectric layer 240 (such as an oxide layer) between the first gate 230 and the first channel region 210.

The second transistor 300 includes the second gate 330, the second channel region 310, the second terminal 320 and the common terminal 10. The second terminal 320 and the common terminal 10 are respectively a drain and a source of the second transistor 300. It can be understood that there is a second gate dielectric layer 340 (such as an oxide layer) between the second gate 330 and the second channel region 310.

The first transistor 200 and the second transistor 300 share the common terminal 10, which can effectively improve space utilization, thereby reducing device size. The common terminal 10 may be a common source or a common drain of the first transistor 200 and the second transistor 300.

In this embodiment, the gate (first gate) of the first transistor 200 and the gate (second gate) of the second transistor 300 are both buried gate structures.

Of course, the present application is not limited to this. The gates of the first transistor 200 and the second transistor 300 may also be in other forms (for example, planar gates).

In one embodiment, referring to FIG. 2, the method for manufacturing a semiconductor structure further includes: forming a plurality of word lines WL extending in a first direction in the substrate 100.

As an example, the word line WL may be formed in the first gate trench 110a and the second gate trench 110b. The portion of the word line WL corresponding to the active region 110 may serve as the first gate 230 of the first transistor 200 and/or the second gate 330 of the second transistor 300.

A plurality of active regions 110 are staggered, the active regions 110 extend in a second direction, and the second direction is inclined at a preset angle with respect to the first direction.

Within the limited substrate space, more active regions can be arranged, thereby increasing the density of memory cells.

In one embodiment, in the second direction, the first transistors and the second transistors located in the adjacent active regions are disposed opposite to each other; and in the first direction, the first transistors and the second transistors located in the adjacent active regions correspond to the same word line.

In one embodiment, referring to FIG. 3, every two active regions 110 among the plurality of active regions 110 constitute an active region pair, the active region pairs are arranged in an array, and the active regions extend in the second direction; the first transistors 200 of the two active regions 110 in each active region pair are adjacent and opposite to each other.

In one embodiment, the method for manufacturing a semiconductor structure further includes forming a plurality of word lines WL extending in the first direction in the substrate. The word lines WL include first word lines WL1 and second word lines WL2 alternately arranged in the second direction. The first word line WL1 penetrates the first transistors 200 of the active regions in the active region pairs of the same column, the second word line penetrates the second transistors 300 of the active regions in the active region pairs of the same column, and the two first transistors 200 in the same active region pair are penetrated by the same first word line WL1.

In one embodiment, the active regions extend in the second direction, and the first direction is perpendicular to the second direction.

For the specific limitations on the method for manufacturing a semiconductor structure, reference may be made to the above limitations on the semiconductor structure, and details are not described herein again.

In the description of this specification, the description with reference to the term "one embodiment" or the like means that the specific feature, structure, material or feature described in conjunction with the embodiment or example is included in at least one embodiment or example of the present application. In this specification, the schematic description of the above terms does not necessarily refer to the same embodiment or example.

The technical features of the above embodiments may be combined arbitrarily. For the purpose of simplicity in description, all the possible combinations of the technical features in the above embodiments are not described. However, as long as the combinations of these technical features do not have contradictions, they shall fall within the scope of the specification.

The foregoing embodiments only describe several implementations of the present application, and their descriptions are specific and detailed, but cannot therefore be understood as limitations to the patent scope of the present application. It should be noted that modifications and improvements may be further made for those of ordinary skill in the art without departing from the concept of the present application, and these modifications and improvements fall within the protection scope of the present application. Therefore, the patent protection scope of the present application should be subject to the appended claims.

The invention claimed is:

1. A semiconductor structure, comprising:
  a substrate;
  a first transistor, comprising a first channel region located in the substrate;
  a second transistor, comprising a second channel region located in the substrate, the second channel region having an area different from an area of the first channel region, and the first transistor and the second transistor having a common source or a common drain; and
  a memory cell, connected to the common source or the common drain.

2. The semiconductor structure according to claim 1, wherein
  the memory cell comprises any one of a capacitive memory cell, a resistive memory cell, a magnetic memory cell, a phase change memory cell, and a ferroelectric memory cell.

3. The semiconductor structure according to claim 2, wherein
  the first channel region has a first width;
  the second channel region has a second width, wherein the second width is greater than the first width;
  the memory cell is the magnetic memory cell, the first transistor is used to read data from the magnetic memory cell, and the second transistor is used to write data into the magnetic memory cell.

4. The semiconductor structure according to claim 1, wherein the substrate further comprises at least one active region, the active region having the first transistor and the second transistor;
  the first transistor and the second transistor are distributed on two opposite sides of an extension direction of the active region.

5. The semiconductor structure according to claim 4, further comprising:
  a plurality of word lines extending in a first direction;
  wherein the plurality of active regions are staggered, the active regions extend in a second direction, and the second direction is inclined at a preset angle with respect to the first direction.

6. The semiconductor structure according to claim 5, wherein in the first direction, the first transistors and the second transistors located in the adjacent active regions correspond to the same word line.

7. The semiconductor structure according to claim 4, wherein every two active regions among the plurality of active regions constitute an active region pair, and the active region pairs are arranged in an array; the first transistors of the two active regions in each active region pair are adjacent and opposite to each other.

8. The semiconductor structure according to claim 7, further comprising a plurality of word lines extending in a first direction; wherein the word lines comprise first word lines and second word lines alternately arranged in a second direction;
the first word line penetrates the first transistors of the active regions in the active region pairs of the same column, the second word line penetrates the second transistors of the active regions in the active region pairs of the same column, and the two first transistors in the same active region pair are penetrated by the same first word line.

9. The semiconductor structure according to claim 8, wherein the active regions extend in the second direction, and the first direction is perpendicular to the second direction.

10. The semiconductor structure according to claim 3, wherein the second width is 2 to 5 times the first width.

11. A method for manufacturing a semiconductor structure, comprising:
providing a substrate;
forming a first transistor and a second transistor in the substrate, the first transistor comprising a first channel region located in the substrate, the second transistor comprising a second channel region located in the substrate, the second channel region having an area different from an area of the first channel region, and the first transistor and the second transistor having a common source or a common drain; and
forming a memory cell, the memory cell being connected to the common source or the common drain.

12. The method according to claim 11, wherein the memory cell comprises any one of a capacitive memory cell, a resistive memory cell, a magnetic memory cell, a phase change memory cell, and a ferroelectric memory cell.

13. The method according to claim 12, wherein
the first channel region has a first width;
the second channel region has a second width, wherein the second width is greater than the first width;
the memory cell is the magnetic memory cell, the first transistor is used to read data from the magnetic memory cell, and the second transistor is used to write data into the magnetic memory cell.

14. The method according to claim 13, wherein the forming a first transistor and a second transistor in the substrate comprises:
forming an active region in the substrate, the active region comprising a first portion and a second portion having a width greater than a width of the first portion;
forming a first gate trench and a second gate trench in the first portion and the second portion of the active region respectively, the active region being partitioned by the first gate trench and the second gate trench into a first terminal, a second terminal, and a common terminal between the first terminal and the second terminal; and
filling a gate material in the first gate trench and the second gate trench to form a first gate and a second gate.

15. The method according to claim 14, wherein the second width is 2 to 5 times the first width.

\* \* \* \* \*